(12) United States Patent
Im et al.

(10) Patent No.: US 12,230,601 B2
(45) Date of Patent: Feb. 18, 2025

(54) HIGH POWER MODULE PACKAGE STRUCTURES

(71) Applicant: SEMICONDUCTOR COMPONENTS INDUSTRIES, LLC, Phoenix, AZ (US)

(72) Inventors: Seungwon Im, Seoul (KR); JooYang Eom, Gimpo-si (KR); Inpil Yoo, Unterhaching (DE); Oseob Jeon, Seoul (KR)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 399 days.

(21) Appl. No.: 17/650,265

(22) Filed: Feb. 8, 2022

(65) Prior Publication Data

US 2023/0253362 A1 Aug. 10, 2023

(51) Int. Cl.
*H01L 23/00* (2006.01)
*H01L 23/495* (2006.01)
*H01L 25/065* (2023.01)

(52) U.S. Cl.
CPC ........ *H01L 24/83* (2013.01); *H01L 23/49568* (2013.01); *H01L 23/49575* (2013.01); *H01L 24/32* (2013.01); *H01L 24/33* (2013.01); *H01L 25/0655* (2013.01); *H01L 2224/32245* (2013.01); *H01L 2224/33181* (2013.01); *H01L 2224/8334* (2013.01)

(58) Field of Classification Search
None
See application file for complete search history.

(56) References Cited

U.S. PATENT DOCUMENTS

| 8,754,512 | B1 | 6/2014 | Taylor et al. |
| 11,011,443 | B2* | 5/2021 | Suwa .................... H01L 23/29 |
| 2012/0025393 | A1* | 2/2012 | Kirsch .................. H01L 23/047 257/773 |
| 2014/0151864 | A1 | 6/2014 | Taylor et al. |
| 2014/0353818 | A1 | 12/2014 | Geitner et al. |
| 2019/0385985 | A1 | 12/2019 | Tsuchimochi et al. |
| 2020/0185310 | A1* | 6/2020 | Cho ....................... H01L 24/83 |
| 2020/0373213 | A1* | 11/2020 | Song .................... H01L 23/4822 |

FOREIGN PATENT DOCUMENTS

DE 112016005570 T5 10/2018

OTHER PUBLICATIONS

Extended European Search Report for counterpart EP Application No. 22217224.9, mailed Jun. 6, 2023, 9 pages.

\* cited by examiner

*Primary Examiner* — Michelle Mandala
*Assistant Examiner* — Jordan M Klein
(74) *Attorney, Agent, or Firm* — Brake Hughes Bellermann LLP (57) ABSTRACT

A method includes disposing a first direct bonded metal (DBM) substrate substantially parallel to a second DBM substrate a distance apart to enclose a space. The method further includes disposing at least a semiconductor die in the space, and bonding the semiconductor die to the first DBM substrate using a first adhesive layer without an intervening spacer block between the semiconductor die and the first DBM substrate, and bonding the semiconductor die to the second DBM substrate using a second adhesive without an intervening spacer block between the semiconductor die and the second DBM substrate.

20 Claims, 8 Drawing Sheets

HIGH POWER MODULE PACKAGE STRUCTURES

TECHNICAL FIELD

This description relates to high power device modules and package structures.

BACKGROUND

Semiconductor power devices (e.g., power MOSFETS) can be manufactured as discrete devices as opposed to being integrated in an integrated circuit (IC). As is typical with power devices, thermal performance may dictate failure rates when components are heated above certain temperatures. For industrial applications (e.g., automotive inverter applications), a circuit package can be a dual-side cooled device package that can draw heat away from both sides of the power device. In a typical dual-side cooled package, a stack of the power device die and a conducting spacer block is assembled and placed between a top and a bottom heat conducting substrate (e.g., double-bonded copper (DBC) substrate), and encased in molding material. The power device die is positioned to conduct heat to (i.e., is thermally coupled to) one of the top or bottom substrates. The conductive spacer block is thermally coupled to both the semiconductor die and to the other of the top or bottom substrates. Adhesive layers (e.g., solder) is used for coupling the different components (e.g., DBC substrate, dies, spacer block, etc.) together. The assembly is encased in molding material to form the dual-side cooled device package. Terminals, pins or leadframes extend from inside to outside of the device package to provide electrical connections to the enclosed power device.

SUMMARY

A method includes disposing a first direct bonded metal (DBM) substrate substantially parallel to a second DBM substrate a distance apart to define a space. The method further includes disposing at least a semiconductor die in the space, and bonding the semiconductor die (e.g., directly) to the first DBM substrate using a first adhesive layer without any intervening spacer block between the semiconductor die and the first DBM substrate, and bonding the semiconductor die (e.g., directly) to the second DBM substrate using a second adhesive layer without any intervening spacer block between the semiconductor die and the second DBM substrate.

The method further included disposing a portion of a leadframe in the space to be direct contact with at least one the first DBM substrate and the second DBM substrate. The portion of a leadframe inserted in the space may be metal stock that is coined to fit in the space. The coined portion of the may have a height that is comparable (e.g., slightly less than) a height of the space.

A package includes a first direct bonded metal (DBM) substrate disposed substantially parallel to a second DBM substrate a distance apart to define a space, and at least a semiconductor die disposed in the space. The semiconductor die is thermally coupled directly to the first DBM substrate by a first adhesive layer without an intervening spacer block between the semiconductor die and the first DBM substrate, and is thermally coupled directly to the second DBM substrate by a second adhesive layer without an intervening spacer block between the semiconductor die and the second DBM substrate.

DESCRIPTION

In some implementations, the sub-modules and packages described herein include high power devices that are assembled together into a single package. For example, the sub-modules or packages can include a single semiconductor die or multiple semiconductor die (e.g., silicon semiconductor die, silicon carbide (SiC) semiconductor die, insulated-gate bipolar transistor (IGBT) die, metal-oxide-semiconductor field effect transistor (MOSFET) die, etc.). Assembling multiple semiconductor die together in a single package can provide high performance and high reliability configurations for electrical performance of the sub-modules. Alternatively or additionally, assembling multiple semiconductor die together in a single package can lead to improvement in thermal management while maintaining proper electrical performance of the sub-modules. The multiple semiconductor die may be assembled together in the single package so that two package components (including packaging materials or substrates) can conduct heat to and from each other (in other words, the two package components can be thermally coupled).

A typical dual-side cooled device package can include a semiconductor die disposed between a first DBC substrate and a second DBC substrate. In the package, the semiconductor die is positioned to conduct heat to (i.e., is thermally coupled to) the first DBC substrate and a conductive spacer block is disposed between the semiconductor die and the second DBC substrate. The conductive spacer block is thermally coupled to both the semiconductor die and to the second DBC substrate. The dual-side cooled device package can include a leadframe for accessing electrical terminals of the device, for example, through a circuit board in the first DBC substrate and the second DBC substrate.

Like the semiconductor die for the modern high power devices (e.g., insulated gate bipolar transistors (IGBTs), fast recovery diodes (FRD), etc.), modern power module packages have increasingly large areas and decreasing thicknesses. The modern power high power devices can have silicon die sizes that are substantially greater than the silicon die sizes of previous high power devices (e.g., <100 square millimeters). For example, the modern power high power devices may have silicon die sizes that are greater than 100 square millimeters or even greater than 225 square millimeters. Further, the modern power high power devices along with the greater silicon die size can have thinner and thinner silicon thicknesses (e.g., a thickness of 70 micrometers or less). As a result, the modern power module packages have increasingly large areas and decreasing thicknesses leading to increased susceptibility to thermally induced stress and defects (e.g., warpage).

To meet a higher thermal performance, thermal-mechanical stress balance across all components (DBC substrates, semiconductor die, spacer blocks, leadframe, mold compounds, solder, etc.) and their material properties have to be considered. For example, the components of a sub-module or package may be required to have low or closely matching coefficients of thermal expansion (CTE) (e.g., of the spacer block and the semiconductor die). There is a limited selection of low CTE material that can be used for the conductive spacer block without causing problems with cracking (e.g., of the semiconductor die, and the inter-component adhesive layers, etc.) during thermal cycling of the package. Only expensive materials with low CTE (e.g., copper molybdenum (CuMo)/aluminum silicon carbide (AlSiC) having 8~9 ppm CTE)) are considered for use as the conductive spacer block.

In addition to a high cost of the conductive spacer block, complex processing steps for spacer interconnection are required in assembly of a power module or dual-side cooled device package that includes a conductive spacer block. Further, in typical assembly using conductive spacer blocks, component tolerances (e.g., substrate thickness tolerance, spacer block thickness tolerance, three adhesive layer thickness tolerances) and assembly jig tolerances (e.g., die attach, spacer attach, and stacking jigs tolerances, etc.) are not tightly controlled adequately at least because of the large number of components and jigs involved. The lack of tight tolerances can result in large mechanical stresses and die cracking in an assembled dual-side cooled power module or device package that includes a spacer block.

Example power modules and dual-side cooled device packages that avoid the high cost and assembly tolerance issues associated with use of conductive spacer blocks in the modules and packages are disclosed herein.

Figure 1A:
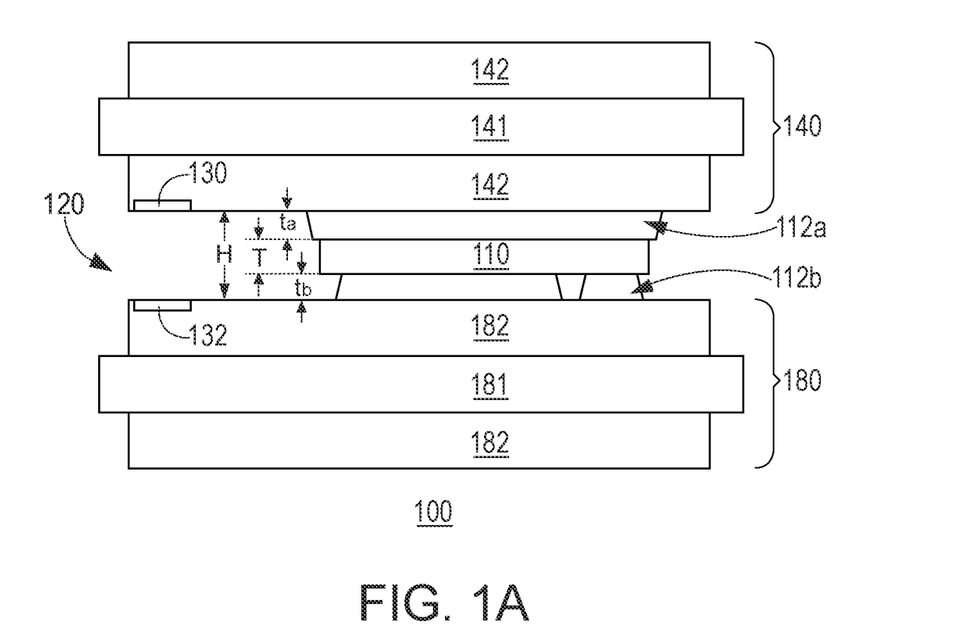
FIG. 1A illustrates an example sub-module a including a semiconductor device die sandwiched between a pair of substrates with no intermediate conductive spacer block between the semiconductor die and the substrates.

FIG. 1A shows, in cross sectional view, an example sub-module 100 including a semiconductor device die 110 (a single or multiple semiconductor device die) sandwiched between (e.g., in a gap between) a pair of substrates with no intermediate or intervening conductive spacer block (e.g., a spacer block is excluded) between the die and the substrates in accordance with the principles of the present disclosure.

Figure 1B:
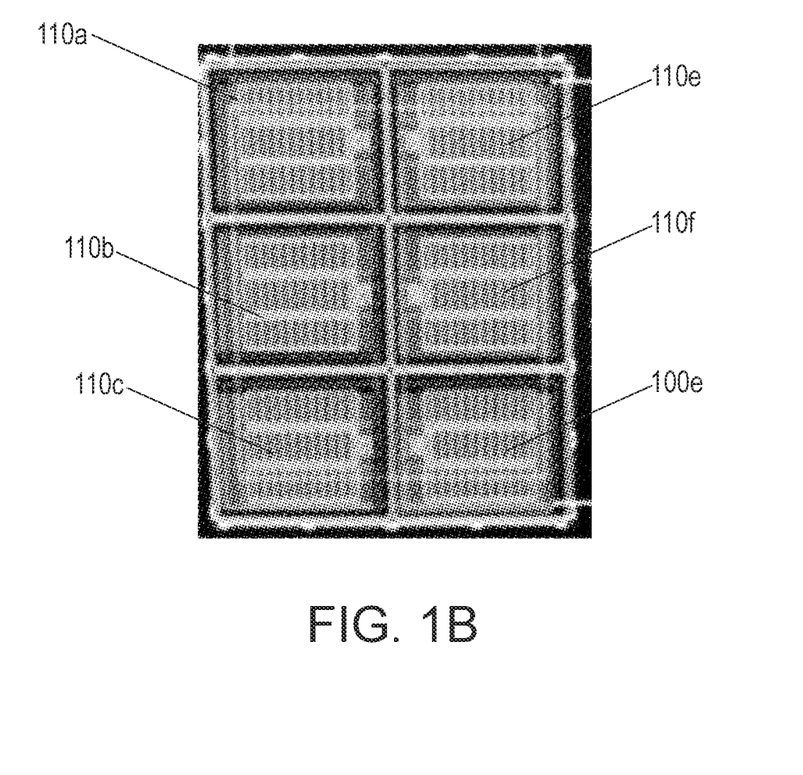
FIG. 1B pictorially represents a multiple semiconductor device die configuration.

FIG. 1B pictorially represents a multiple semiconductor device die configuration 110M. The configuration may include multiple dies (e.g., dies 110a, 110b, 110c, 110d, and 110e) that may be included in sub-module 100. Dies 110a, 110b, 110c 110d, and 110e may, for example, be diodes or transistors made of wide band gap (WBG) material (e.g., silicon carbide (SiC)). In FIG. 1B and while discussing sub-module 100 herein, single semiconductor device die 110 may represent a single semiconductor device die or multiple semiconductor device dies (e.g., multiple semiconductor device die configuration 110M).

In a sub-module 100 shown in FIG. 1A, a semiconductor device die 110 may, for example, be a power device die (e.g., an IGBT, a FRD, etc.). Device die 110 may be made of, for example, silicon material or a WBG semiconductor material. Device die 110 may be sandwiched (placed in the gap) between a pair of opposing substrates 140, 180. Device die 110 may be have a thickness T. In example implementations, thickness T depending for example, on device type, may be between about 5 microns and 50 microns.

An example substrate 140, 180 can be a direct bonded metal (DBM) substrate (e.g., direct bonded copper (DBC) substrate, a DBM circuit board, etc.). In some implementations, one or more of the DBM substrates 140, 180 can include a dielectric layer disposed between two metal layers. Substrate 140 and substrate 180 may, for example, include dielectric layers (e.g., a ceramic layer, a polymer layer) 141 and 181 that are plated, coated, or printed, on both sides, with copper or other electrically conductive material layers (e.g., conductive layer 142, conductive layer 182). Dielectric layers 141 and 181 may be made from electrically insulating, but thermally conductive materials (e.g., Zr-doped alumina). In some implementations, conductive layer 142 and conductive layer 182 may be, or can include, a copper layer.

Device die 110 may be bonded to (i.e., placed in direct thermal contact with) the pair of opposing substrates 140, 180, using, for example, adhesive layers 112a and 112b, respectively. In example implementations, device die 110 may be placed in a flip-chip configuration on substrate 180. Adhesive layers 112a, 112b may be formed, for example, by a solder bump, a preform solder, a solder paste, a sintering or a fusion bond. Adhesive layers 112a, 112b may, for example, be solder material layers having thicknesses ta, tb, respectively.

Sub-module 100 may have a limited opening, clearance, or in-between space (e.g., in-between space 120, also can be referred to as a space) having a height H between the pair of opposing substrates 140, 180. Height H may be limited by the vertical height or thicknesses (e.g., thickness T) of semiconductor die 110 and vertical heights or thicknesses (e.g., thicknesses ta, tb) of the adhesive layers 212a and 212b used to bond the die to the substrates). The height H, for example, may be equal to or about a same as the sum T+ta+tb. In example implementations, height H may be about a same as semiconductor die thickness T. Semiconductor die thickness T may depend on the type and materials of the device (e.g., IGBT, FRD, silicon, WBG, etc.). In example implementations, semiconductor die thickness T may depend on the type and materials of the device (e.g., IGBT, FRD, silicon, WBG, etc.).

The limited height of in-between space 120 between the two substrates may limit the sizes of other package components (e.g., leadframes 210, 220, FIG. 2) that can be disposed in or placed between the two substrates in the package and wire bonded) e.g., to bonding pads on the substrates) to provide electrical connections to the enclosed (e.g., included) power device (e.g., via bond pads 130, 132 on substrate 140). In the example implementations discussed herein, sub-module 100 is used in a device package with leadframes in direct contact (i.e., in wireless contact) with the bonding pads formed on substrates 140, 180 to provide electrical connections from outside the package to the enclosed power device.

Figure 2:
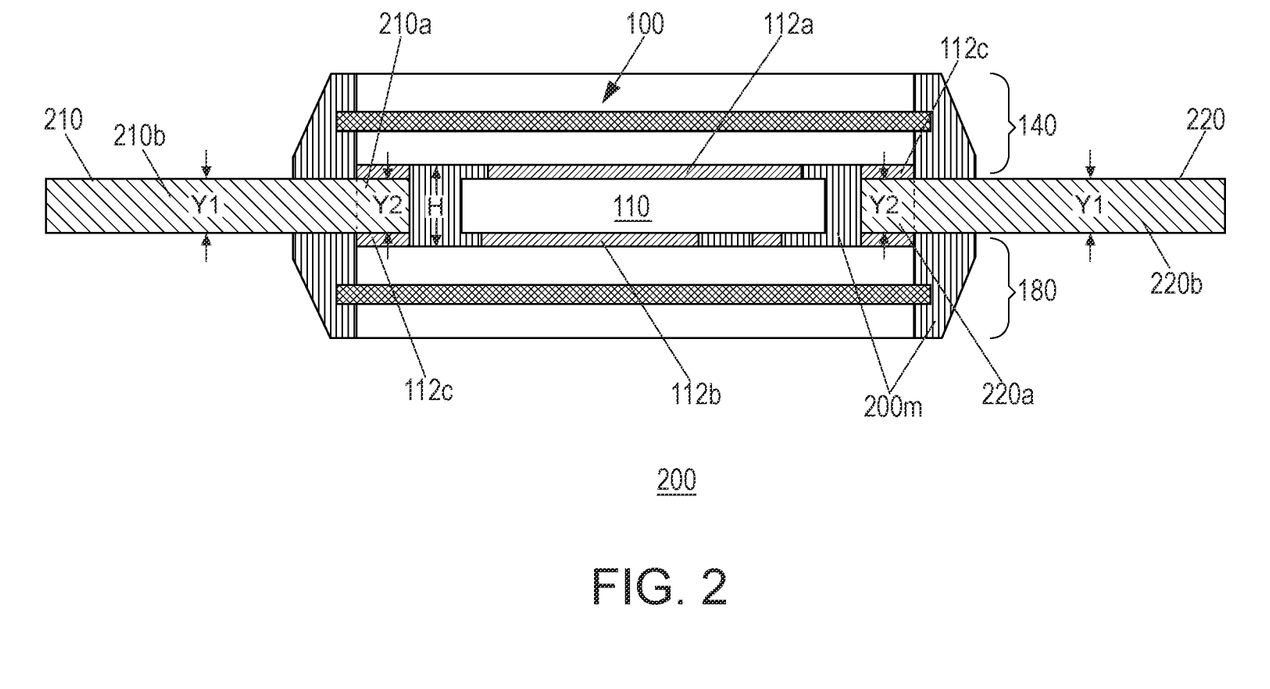
FIG. 2 is a schematic illustration of an example dual-side cooled device package that avoids the use of conductive spacer blocks in the package.

FIG. 2 shows an example dual-side cooled device package (e.g., device module 200) that avoids the use of conductive spacer blocks in the package, in accordance with the principles of the present disclosure.

Device module 200 may include sub-module 100 with leadframe 210 and leadframe 220 in direct contact with substrates 140, 180 to carry electrical signals from die 110 to the outside. For example, on one side of module 200, a portion 210a of leadframe 210 may, for example, be disposed (inserted) in the opening (e.g., in-between space 120, FIG. 1) between substrate 140 and substrate 180 and bonded to bonding pads 130, 132 on the substrates. On another side of module 200, a portion 210b of leadframe 210 may, for example, be disposed (inserted) in the opening (e.g., in-between space 120, FIG. 1) between substrate 140 and substrate 180 for bonding to pads (e.g., bonding pads 130, 132, FIG. 1, etc.).

Portions 210a and 210b may have heights Y2 that are similar or comparable to (or slightly less than) the height H of the opening so that the leadframes can be fitted in the opening (in-between space) without mechanical obstruction. Other portions of the leadframes (e.g., portions 210b, 220a) that are not inserted in the opening may have a height Y1 (e.g., Y1>Y2) that is not limited by the height H of the opening.

The bonding of the inserted leadframe portions 210A and 220A to the bonding pads (e.g., bonding pads 130, 132, FIG. 1, etc.) may be accomplished using adhesive layers 112c (e.g., a solder or sintering material, a solder bump, a preform solder, a solder paste, sintering or a fusion bond.). Further, in example implementations, components of device module 200 may be encapsulated in mold material 200m (e.g., electrically isolating encapsulation material). Mold material 200m may electrically isolate at least one component of the package (e.g., semiconductor die, leadframes, etc.) from the other components.

Figure 3A:
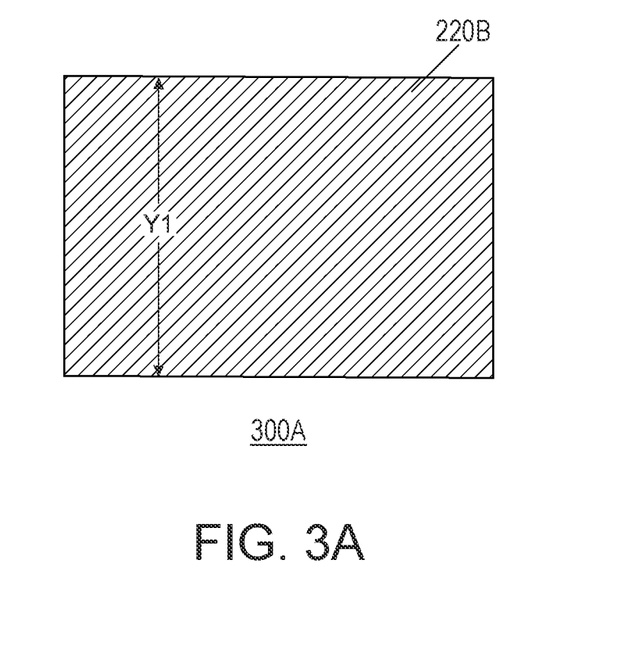
FIG. 3A is a schematic illustration of an example metal stock as a single gauge bar.
Figure 3B:
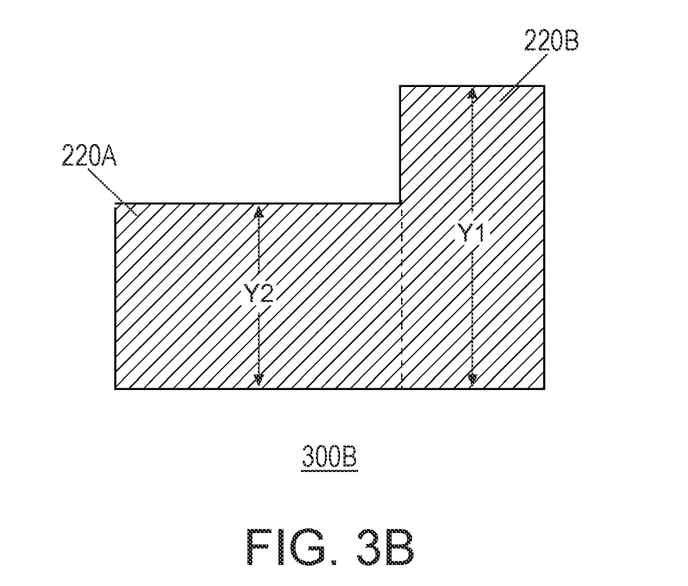
FIG. 3B is a schematic illustration of the single gauge bar of FIG. 3A coined to prepare a dual gauge bar for use as a leadframe.

Leadframe 210 and leadframe 220 be made of standard metal stock (e.g., metal bars, rod or pins). For example, as shown in cross section in FIG. 3A, the standard metal stock may be a single gauge bar 300 having a rectangular cross section with a height Y1 (corresponding, for example, to height Y1 of leadframe portion 220B). In example implementations, height Y1 of single gauge bar 300 may be in the range of about 0.5 millimeters to 1.2 millimeters. In preparation of leadframes (e.g., leadframes 210 and 220), as shown in FIG. 3B, a portion of single gauge bar 300A may be coined to prepare a dual gauge bar 300B for use as, for example, leadframe 220. Dual gauge bar 300B may, for example, have heights Y2 and Y1 corresponding to portions 220A and 220B of leadframe 220.

FIGS. 4A through 4E illustrate an example process 400 for assembling a dual-side cooled device package (e.g., device module 200) that includes semiconductor device die 110 and avoids the use of conductive spacer blocks in the package, in accordance with the principles of the present disclosure.

Figure 4A:
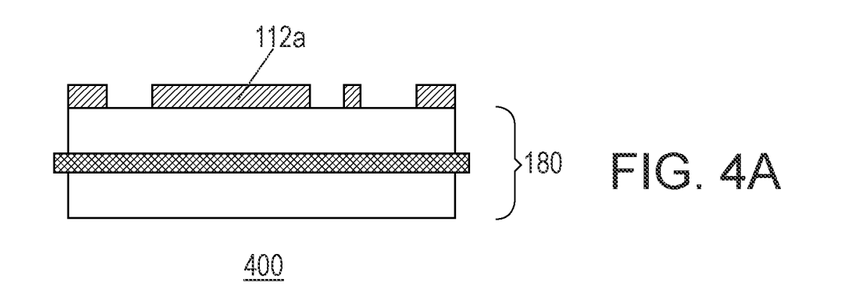
FIGS. 4A through 4E illustrate an example process for assembling a dual-side cooled device package that includes semiconductor device die and avoids the use of conductive spacer blocks in the package.
Figure 4B:
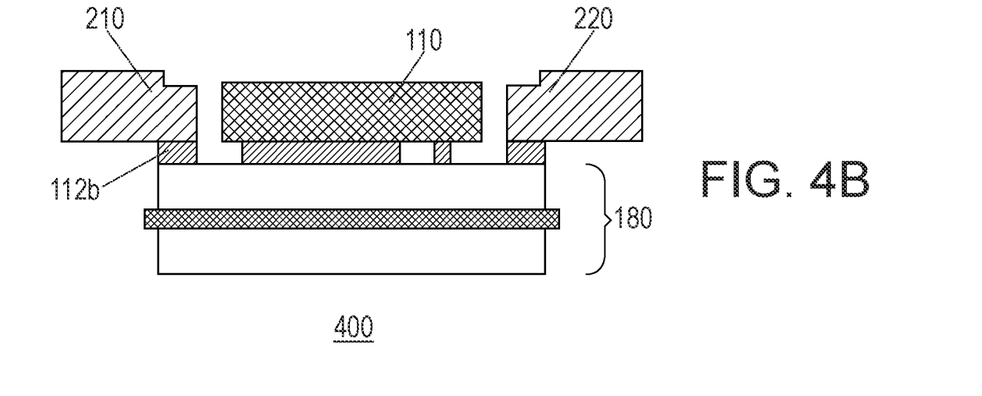

At a stage of the process, as shown in FIG. 4A, an adhesive layer (adhesive layer 112b, a sinter or solder material) may be lithographically patterned and printed on substate 180. At a next stage of the process, as shown in FIG. 4B, device module components (e.g., device die 110, leadframe 210 and leadframe 220) in may be placed or positioned (e.g., using jigs (not shown)) on adhesive layer 112b on the lithographically patterned and printed substate 180. Device die 110 may, for example, be placed on substate 180 in a flip-chip configuration. The components may be bonded to substrate 180 using, for example, sintering or solder reflow processes.

Figure 4C:
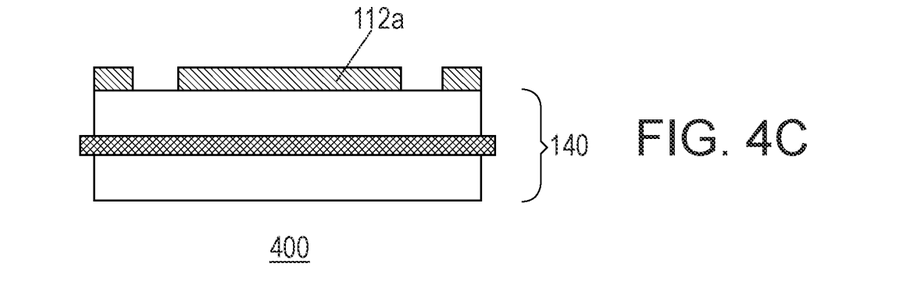

At a stage of the process, as shown in FIG. 4C, an adhesive layer (adhesive layer 112a, a sinter or solder material) may be lithographically patterned and printed on substate 140.

Figure 4D:
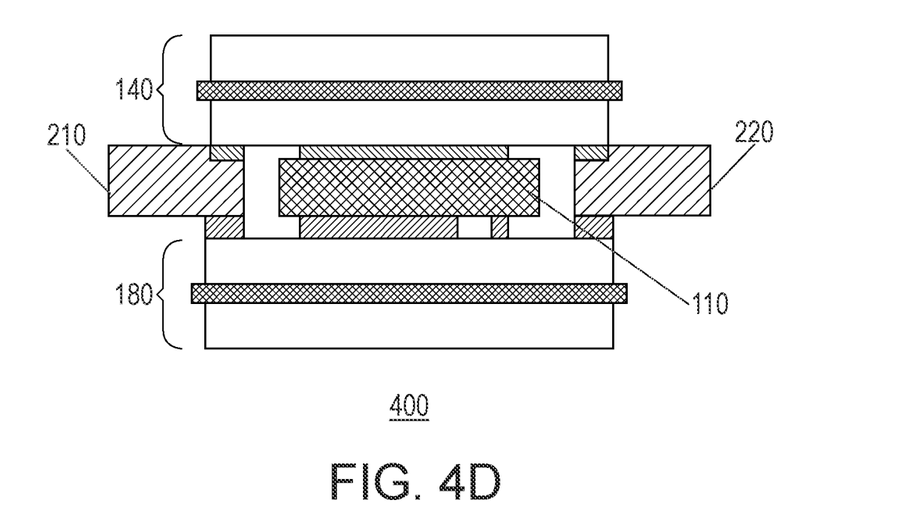

At a next stage of the process, as shown in FIG. 4D, the lithographically patterned and printed substate 140 may be stacked on top of the assembly (FIG. 4B) of the components (e.g., device die 110, leadframe 210 and leadframe 220) on substrate 180. The components may now be bonded to substrate 140 using, for example, sintering or solder reflow processes.

Figure 4E:
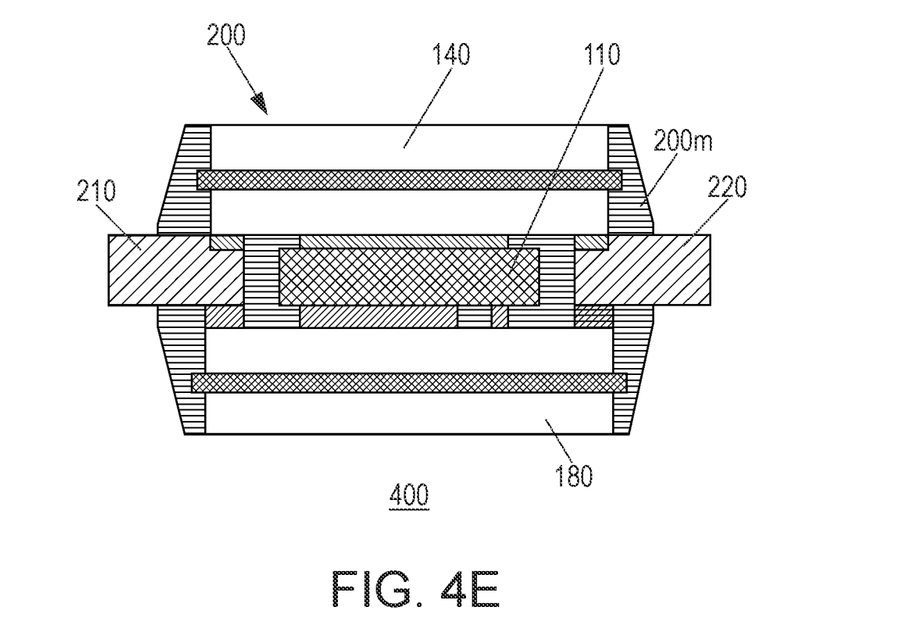

At a next stage of the process, as shown in FIG. 4E, the components may be encased in a mold material (e.g., mold material 200m) to assemble device module 200. Further, trim and forming processes (e.g., to remove burrs, etc.) may be used to complete assembly of device module 200.

Process 400 provides a leadframe direct interconnection between substrates 140 and 180 in device module 200 in a manner that is simpler, and more straightforward with fewer process steps than processes for fabricating typical device modules having conductive spacer blocks. Process 400 may also reduce cost by reducing the number of processing steps, and reduce material costs (e.g., spacer, wire, solder costs) compared to processes for fabricating typical device modules having conductive spacer blocks.

Process 400 also may result in a higher reliability package (e.g., device module 200) by reducing use of CTE mismatched material (e.g., conducive spacer block, wire, solder, etc.) associated with the typical device modules having conductive spacer blocks.

Power devices (e.g., silicon semiconductor die, silicon carbide (SiC) semiconductor die, insulated-gate bipolar transistors (IGBTs), metal-oxide-semiconductor field effect transistor (MOSFET) die, fast recovery diodes (FRD), etc.) may be assembled in a dual-side cooled power device module or package (e.g., device module 200) to benefit from the dual-side cooling, which may be provided by the pair of opposing substrates (e.g., substrate 140 and substrate 180) in the power device module or package. The package components may be assembled together in thermal contact in the module or package to provide high performance, reliability, and/or improvement in thermal management while maintaining proper electrical performance of the power device module or package (e.g., device module 200).

Figure 5:
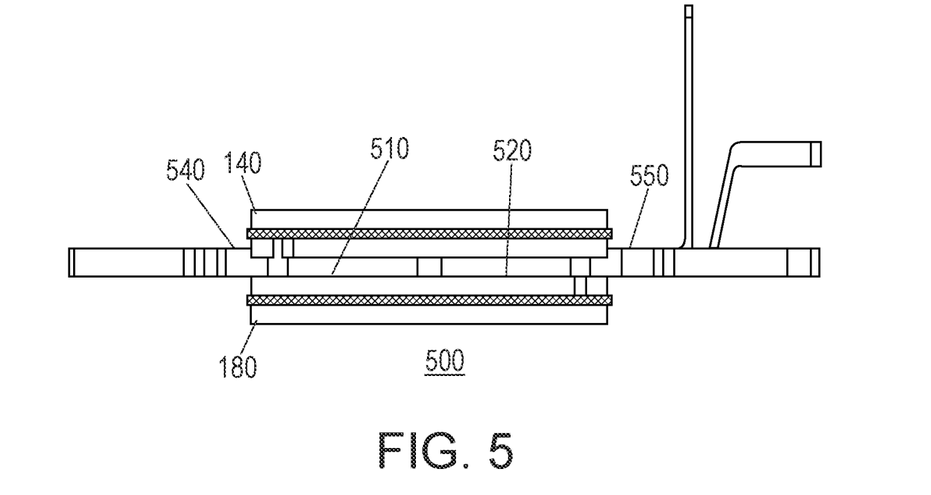
FIG. 5 illustrates an example dual-side cooled device package that includes at least two device die thermally coupled to a pair of opposing substrates without intervening conductive spacer blocks.

As noted previously, a device package (e.g., a dual-side cooled power module or package) may include more than one semiconductor device die enclosed (e.g., at least partially enclosed, disposed) within a pair of opposing substrates (e.g., substrate 140 and substrate 180) without intervening conductive spacer blocks for dual-side cooling. FIG. 5 shows, for example, a side view, of a device package 500 that includes at least two device die 510 and 520 thermally coupled to the pair of opposing substrates 140 and 180 without intervening conductive spacer blocks between the die and either substrate. Device package 500 may also include leadframe 540 and leadframe 550 that are bonded directly to substrate 140 and substrate 180 to carry electrical signals from device die 510 and 520 to the outside of device package 500.

In some implementations, the packages described herein can be used in applications with high voltages (e.g., higher than 600 V), high current densities (e.g., between 100 A to 1500 A (e.g., 1200 A)), and/or high switching frequencies (e.g., greater than 1 kHz). In some implementations, the packages can be used in a variety of industrial applications including, for example, automotive applications (e.g., automotive high power module (AHPM), electrical vehicles (EV), and hybrid electrical vehicles (EHV)), computer applications, industrial equipment, traction invertors, on-board charging applications, inverter applications, and/or so forth.

In an example implementations, as shown in FIGS. 6A through 6E, a high current (e.g., 1200A) bridge circuit (e.g., motor drive circuit) may be provided as a dual-side cooled power module package that includes multiple semiconductor die.

Figure 6A:
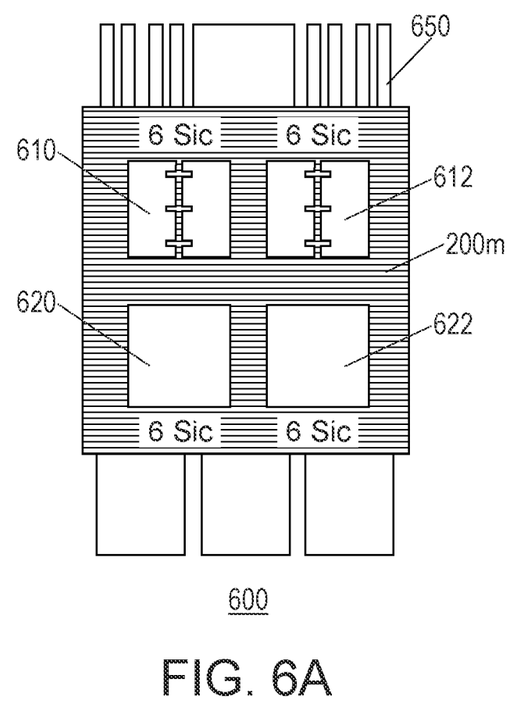
FIG. 6A illustrates a dual-side cooled power module package including a bridge circuit for an EV system.

FIG. 6A shows, for example, a dual-side cooled power module package (e.g., unit 600) including a bridge circuit for an EV system. Unit 600 may include multiple device sub-modules (e.g., sub-modules 610, 612, 620 and 622) placed on a leadframe structure 650 and encased (at least partially) in a molding material (e.g., molding material 200m). Each of sub-modules 610, 612, 620 and 622 may enclose (e.g., at least partially enclose, dispose) multiple semiconductor die (e.g., multiple semiconductor device die configuration 110M) within the pair of opposing substrates 140 and 180 without an intervening conductive spacer block for dual-side cooling. Having multiple semiconductor die enclosed within the same substrates may result in equal or uniform cooling and a better temperature-balanced electrical performance of multiple semiconductor die in electrical circuits.

Figure 6B:
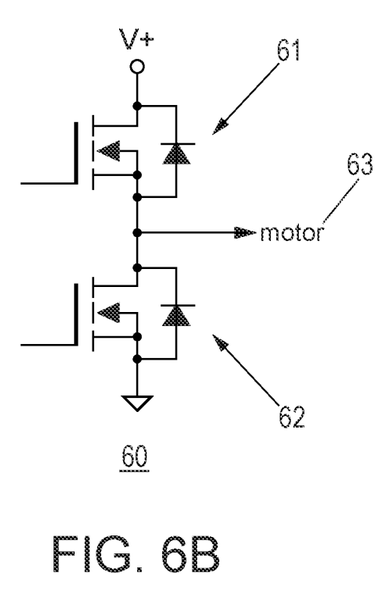
FIG. 6B illustrates a circuit diagram of an example bridge driver circuit.
Figure 6C:
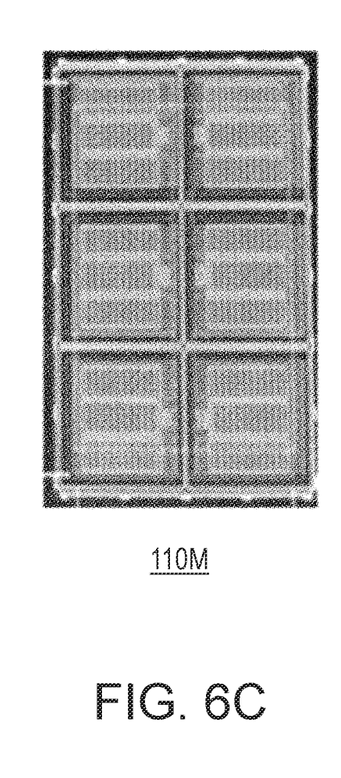
FIG. 6C is a pictorial representation of a multiple semiconductor device die configuration that may be included in the dual-side cooled power module package of FIG. 6A.

FIG. 6C (like FIG. 1B) is a pictorial representation of multiple dies (e.g., dies 110a, 110b, 110c, 110d, 110e, and 100f) that may be included the multiple semiconductor device die (e.g., multiple semiconductor device die configuration 110M) that are enclosed, for example, in sub-modules 610, 612, 620 and 622. Each of the multiple semiconductor die may be thermally coupled to the first DBM substrate and the second DBM substrate without any intervening spacer blocks.

Dies 110a, 110b, 110c 110d, 110e. and 110f in multiple semiconductor device die configuration 110M may, for example, include devices (e.g., WBG diodes) made of silicon carbide (SiC).

Unit 600 may provide a bridge driver circuit (e.g., a load driver circuit such as a motor driver circuit). FIG. 6B shows a circuit diagram of an example bridge driver circuit 60 that may be provided by unit 600. Bridge driver circuit 60 may include a high-side half-bridge 61 and a low-side half-bridge 62 to drive a load (e.g., a motor 63).

In unit 600 shown in FIG. 6A, sub-modules 610 and 612 (e.g., each containing six SiC devices) may be placed in parallel to form a high-side half-bridge driver. Further, sub-modules 620 and 622 (e.g., each contain six SiC devices) may be placed in parallel to form a low-side half-bridge driver.

Figure 6D:
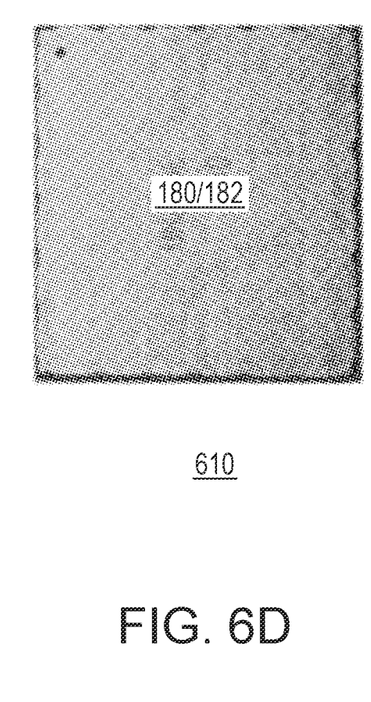
FIG. 6D and FIG. 6E show a top view and a bottom view of a sub-module in which the multiple semiconductor device die configuration of FIG. 6C is enclosed (e.g., disposed) between the pair of opposing substrates without intervening conductive spacer block for dual-side cooling.
Figure 6E:
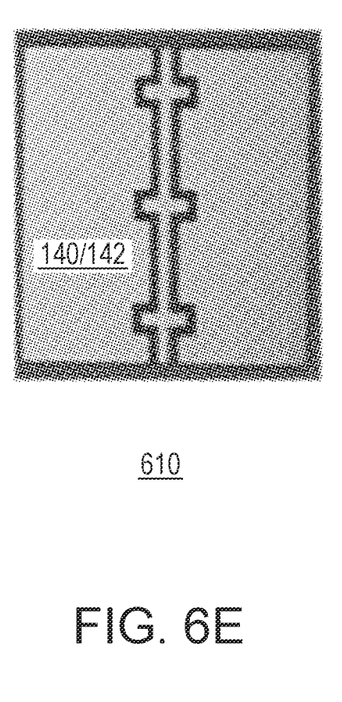

FIG. 6D and FIG. 6E shows top and bottom views of a sub-module (e.g., sub-module 610) in which multiple semiconductor device die configuration 110M (FIG. 6C) is enclosed (e.g., disposed between) between the pair of opposing substrates 140 and 180 without intervening conductive spacer block for dual-side cooling. In top and bottom views shown in FIG. 6D and FIG. 6E only outer copper layers 182 or 142 of substrates 140, 180 are visible with the enclosed multiple semiconductor device die configuration 110M hidden from view.

In unit 600 shown in FIG. 6A, sub-modules 610 and 612 (e.g., each containing six SiC devices) may be placed in parallel to form a high-side half-bridge driver (e.g., high side half-bridge 61, FIG. 6B). Further, sub-modules 620 and 622 (e.g., each containing six SiC devices) may be placed in parallel to form a low-side half-bridge driver (e.g., low side half-bridge 62, FIG. 6B). The large number of parallel die (e.g., 2×6=12 die) in each half-bridge may result in increased current carrying capacity and an increased power rating for unit 600.

Figure 7:
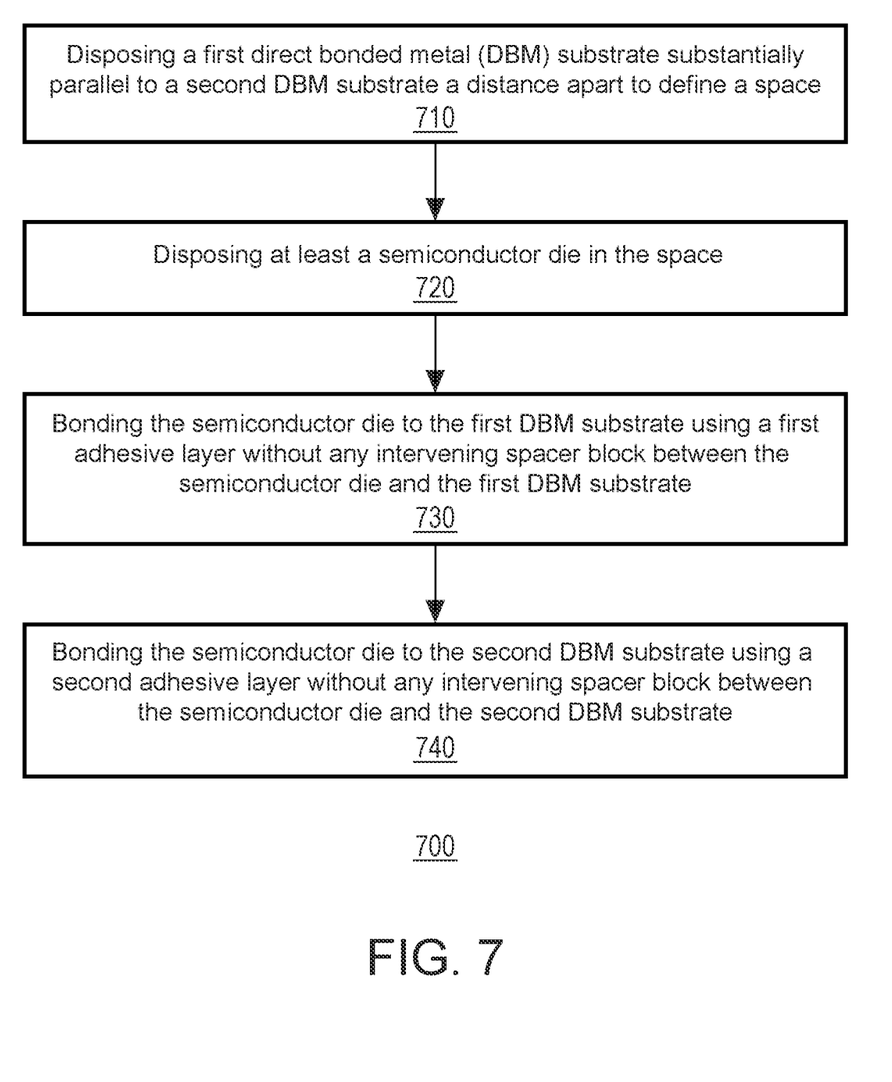
FIG. 7 illustrates an example method for assembling an example dual-side cooled device package that avoids the use of conductive spacer blocks.

FIG. 7 shows an example method 700 for assembling an example dual-side cooled device package that avoids the use of conductive spacer blocks.

Method 700 includes disposing a first direct bonded metal (DBM) substrate substantially parallel to a second DBM substrate a distance apart to define a space (710), and disposing at least a semiconductor die in the space (720). The method further includes bonding the semiconductor die to the first DBM substrate using a first adhesive layer without any intervening spacer block between the semiconductor die and the first DBM substrate (730), and bonding the semiconductor die to the second DBM substrate using a second adhesive without any intervening spacer block between the semiconductor die and the second DBM substrate (740).

The method further includes disposing a portion of a leadframe in the space to be in direct contact with at least one the first DBM substrate and the second DBM substrate. The portion of the leadframe inserted in the space has a height that is equal to, or about a same as, a height of the space between the first DBM substrate and the second DBM substrate. Further, the portion of the leadframe disposed in the space may be a portion of a stock metal coined to fit the space.

The method further includes bonding the portion of the leadframe disposed in the space to a bond pad on the first DBM substrate.

Some implementations of the packages, modules, and sub-modules described herein may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), and/or so forth.

The terminology used herein is for the purpose of describing particular implementations only and is not intended to be limiting of the implementations. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Example implementations of the present inventive concepts are described herein with reference to cross-sectional illustrations that are schematic illustrations of idealized implementations (and intermediate structures) of example implementations. As such, variations from the shapes of the illustrations as a result, for example, of manufacturing techniques and/or tolerances, are to be expected. Thus, example implementations of the present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example implementations.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present implementations.

Unless otherwise defined, all terms (including technical and scientific terms) used herein have the same meaning as commonly understood by one of ordinary skill in the art to which this present inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A package, comprising:
a first direct bonded metal (DBM) substrate disposed parallel to a second DBM substrate a distance apart to define a space between the first DBM substrate and the second DBM substrate;
at least a semiconductor die disposed in the space, the semiconductor die being thermally coupled directly to the first DBM substrate by a first adhesive layer without an intervening spacer block between the semiconductor die and the first DBM substrate, and being thermally coupled directly to the second DBM substrate by a second adhesive layer without an intervening spacer block between the semiconductor die and the second DBM substrate; and
a leadframe having a first portion disposed in the space and a second portion disposed outside the space, the first portion having a height that is less than a height of the second portion.

2. The package of claim 1, wherein the semiconductor die is thermally coupled to the first DBM substrate in a flip-chip configuration.

3. The package of claim 1, wherein the first adhesive layer is formed by at least one of a solder bump, a preform solder, a solder paste, a sintering or a fusion bond.

4. The package of claim 1, wherein the first portion of the leadframe is disposed in the space in direct contact with at least one the first DBM substrate and the second DBM substrate.

5. The package of claim 4, wherein the height of the first portion of the leadframe being disposed in the space is equal to, or a same as, a height of the space between the first DBM substrate and the second DBM substrate.

6. The package of claim 4, wherein the first portion of the leadframe being disposed in the space is a portion of a stock metal coined to fit in the space.

7. The package of claim 4, wherein the first portion of the leadframe inserted in the space is bonded to a bond pad on the first DBM substrate by a third adhesive layer.

8. The package of claim 7, wherein the third adhesive layer is formed by at least one of a solder bump, a preform solder, a solder paste, and a sintering or a fusion bond.

9. The package of claim 1, further comprising molding material electrically isolating at least one component of the package from other components of the package.

10. The package of claim 1, wherein multiple semiconductor die are disposed in the space, each of the multiple semiconductor die being thermally coupled to the first DBM substrate and the second DBM substrate without any intervening space blocks.

11. A package, comprising:
a leadframe structure including a dual gauge bar, the dual gauge bar having a first portion with a first height and a second portion having a second height, the first height being less than the second height;
multiple device sub-modules placed on the leadframe structure; and
each of the multiple device sub-modules including at least a semiconductor device die disposed in a space between a first direct bonded metal (DBM) substrate and a second DBM substrate, the semiconductor device die being bonded directly to the first DBM substrate and the second DBM substrate without any intervening spacer blocks for dual-side cooling, the first portion of the dual gauge bar being disposed in the space.

12. The package of claim 11, wherein the at least a semiconductor device die includes a wide band gap semiconductor device.

13. The package of claim 11, wherein each of the multiple device sub-modules includes a multiple semiconductor device die configuration.

14. The package of claim 13, wherein the multiple semiconductor device die configuration includes silicon carbide devices.

15. The package of claim 11, wherein the multiple device sub-modules placed on the leadframe structure form a bridge driver circuit, and the multiple device sub-modules include sub-modules placed in parallel to form a high-side half-bridge driver and sub-modules placed in parallel to form a low-side half-bridge driver.

16. A method comprising:
disposing a first direct bonded metal (DBM) substrate parallel to a second DBM substrate a distance apart to define a space;
disposing at least a semiconductor die in the space,
bonding the semiconductor die to the first DBM substrate using a first adhesive layer without any intervening spacer block between the semiconductor die and the first DBM substrate;
bonding the semiconductor die to the second DBM substrate using a second adhesive without any intervening spacer block between the semiconductor die and the second DBM substrate; and
disposing a first portion of a leadframe in the space, the first portion having a height that less than a height of a second portion of the leadframe that is not disposed in the space.

17. The method of claim 16, wherein disposing the first portion of the leadframe in the space includes placing the first portion in direct contact with at least one the first DBM substrate and the second DBM substrate.

18. The method of claim 17, wherein the first portion of the leadframe disposed in the space has a height that is equal to, or a same as, a height of the space between the first DBM substrate and the second DBM substrate.

19. The method of claim 18, wherein the first portion of the leadframe being disposed in the space is a portion of a stock metal coined to fit the space.

20. The method of claim 16, wherein the first portion of the leadframe disposed in the space is bonded to a bond pad on the first DBM substrate.

* * * * *